US009042486B2

(12) United States Patent
Cowan

(10) Patent No.: US 9,042,486 B2
(45) Date of Patent: May 26, 2015

(54) SIDEBAND SUPPRESSION IN ANGLE MODULATED SIGNALS

(71) Applicant: ZBW LLC, Stromsburg, NE (US)

(72) Inventor: Sam Cowan, Stromsburg, NE (US)

(73) Assignee: ZBW LLC, Stromsburg, NE (US)

( * ) Notice: Subject to any disclaimer, the term of this patent is extended or adjusted under 35 U.S.C. 154(b) by 0 days.

(21) Appl. No.: 14/511,234

(22) Filed: Oct. 10, 2014

(65) Prior Publication Data
US 2015/0117570 A1    Apr. 30, 2015

Related U.S. Application Data

(60) Provisional application No. 61/962,084, filed on Oct. 31, 2013.

(51) Int. Cl.
H04L 27/20 (2006.01)
H04B 1/04 (2006.01)

(52) U.S. Cl.
CPC . H04L 27/20 (2013.01); H04B 1/04 (2013.01)

(58) Field of Classification Search
USPC .......................................... 375/302–308, 315
See application file for complete search history.

(56) References Cited

U.S. PATENT DOCUMENTS

| 2,020,409 | A | | 11/1935 | Green |
| 3,378,773 | A | | 4/1968 | Jeffers |
| 4,654,608 | A | * | 3/1987 | Minarik et al. ............... 332/151 |
| 4,742,532 | A | | 5/1988 | Walker |
| 4,817,192 | A | | 3/1989 | Phillips et al. |
| 4,852,086 | A | | 7/1989 | Eastmond et al. |
| 4,955,083 | A | | 9/1990 | Phillips et al. |
| 5,115,468 | A | * | 5/1992 | Asahi et al. .................. 704/203 |
| 5,133,083 | A | | 7/1992 | Crilly, Jr. et al. |
| 5,889,851 | A | | 3/1999 | Hsieh |
| 5,923,374 | A | | 7/1999 | James |
| 6,211,996 | B1 | | 4/2001 | Fuse |
| 6,288,618 | B1 | | 9/2001 | Stevenson et al. |

(Continued)

FOREIGN PATENT DOCUMENTS

| GB | 2004442 | 3/1979 |
| WO | 03013089 | 2/2003 |

OTHER PUBLICATIONS

ZBW LLC, PCT/US2014/063126 filed Oct. 30, 2014, "The International Search Report and the Written Opinion of the International Searching Authority, or the Declaration", mailed Feb. 19, 2015.

Primary Examiner — Dac Ha
Assistant Examiner — Janice Tieu
(74) Attorney, Agent, or Firm — McKee, Voorhees & Sease, P.L.C.

(57) ABSTRACT

In an angle modulated radio transmitter, the total power is the same when modulated or unmodulated. Angle modulation produces multiple sideband pairs. The power in the sidebands is derived from the carrier. When a complex modulating waveform is used, the power (and therefore the amplitude) of the carrier varies. A system and method is provided for dramatically minimizing, to nearly zero, the bandwidth needed to transmit digital information using sideband suppression of angle modulated signals. The systems described use various techniques to suppress sideband pairs, leaving the carrier signal. The amplitude variations of the carrier are used to convey information. In some examples, techniques are used to filter and/or phase out one or more sideband pairs, leaving the carrier signal.

9 Claims, 12 Drawing Sheets

(56) References Cited

U.S. PATENT DOCUMENTS

| | | |
|---|---|---|
| 6,901,246 B2 | 5/2005 | Bobier et al. |
| 8,000,612 B2 | 8/2011 | Ohira et al. |
| 8,100,832 B2 | 1/2012 | Kunita |
| 8,649,746 B2 | 2/2014 | Kang et al. |
| 2007/0237218 A1 | 10/2007 | Walker |
| 2008/0180189 A1* | 7/2008 | Miya ............................ 333/103 |
| 2008/0181332 A1* | 7/2008 | Tian et al. ..................... 375/308 |
| 2009/0009259 A1 | 1/2009 | Ohira et al. |
| 2010/0083012 A1* | 4/2010 | Corbridge et al. ............ 713/300 |
| 2014/0156613 A1 | 6/2014 | Meadows |

\* cited by examiner

SIDEBAND SUPPRESSION IN ANGLE MODULATED SIGNALS

CROSS REFERENCE TO RELATED APPLICATIONS

This application claims priority under 35 U.S.C. §119, commonly owned U.S. provisional patent application Ser. No. 61/962,084 filed on Oct. 31, 2013, entitled "TRANSMITTING INFORMATION ON ZERO BANDWIDTH", which is incorporated by reference herein.

FIELD OF THE INVENTION

This disclosure relates to electronic communication. In particular, this disclosure is drawn to techniques for minimizing the bandwidth required by using the fact that the sideband power is derived from the carrier. If the sidebands are phased out, what is left behind is a single spectrum component varying in amplitude. These amplitude variations can be used to transmit information.

BACKGROUND OF THE INVENTION

Angle modulation includes both frequency modulation and phase modulation. Frequency modulation and phase modulation are related and can be converted from one to the other, as one skilled in the art understands.

Angle modulation (frequency and phase) produces multiple sideband pairs. These pairs are separated from the carrier in frequency by integer multiples of the modulating frequency. The power in the sidebands is derived from the carrier such that the total power is unchanged from no modulation to modulation. The amplitude of the carrier and each sideband pair is a function of the modulation index, and are determined by Bessel functions. A table and graph of Bessel functions are shown in FIG. 1.

The sideband structure of an angle modulated carrier is given in most electronic communication textbooks. The following characteristics of angle modulation are helpful in understanding the present disclosure. The amplitude of a carrier and sideband pairs are given by Bessel functions and vary with a given modulation index (the value of the modulation index indicates the power level of the carrier and sidebands). The total power of the modulated signal remains constant and the power in the sidebands is derived from the carrier. The vector sums of the odd order sideband pairs are in quadrature (+90, −90 degrees) with the carrier. These generate angle variation in the time domain. The vector sums of the even order sideband pairs are collinear (0, −180 degrees) with the carrier. These generate amplitude variations in the time domain.

A typical sideband can be represented by the following equation, $$\sin(2\pi f_c t + M \sin(2\pi f_a t))$$

where:
$f_c$=carrier frequency,
$f_a$=audio frequency, and
M=modulation index.

What most texts fail to explain is that angle modulation is a nonlinear system. The graph of Bessel functions in most texts is given for a single sinusoidal modulating signal. When a complex modulating signal is used, "beat" frequencies are produced that are the sum and difference of the modulating frequencies. The vector sums of these "beat" frequency pairs are collinear with the carrier and produce amplitude variation in the time domain.

Space in the electromagnetic spectrum is at a premium. New services in voice and data are requiring more spectrum. Reducing the bandwidth required to transmit and receive information can open the available spectrum space for many more services.

SUMMARY OF THE INVENTION

A system for suppressing sidebands in angle modulated signals is provided including first phase modulation circuitry for modulating a signal, phase shift circuitry for phase shifting the modulating signal by a first amount, second modulation circuitry for modulating the shifted modulating signal, and summing circuitry for combining outputs of the first and second modulation circuitry.

Another embodiment provides a method of suppressing sidebands in angle modulated signals including providing a modulating input signal, phase modulating the input signal, phase shifting the input signal by a first amount, phase modulating the phase shifted input signal, and combining the modulated input signal with the modulated phase shifted input signal.

Another embodiment provides a method of minimizing the bandwidth needed to transmit signals using angle modulation including providing a modulating input signal, phasing out one or more sideband pairs from the modulating input signal, phase modulating the input signal, and transmitting the modulated signal.

Other features and advantages of the present disclosure will be apparent from the accompanying drawings and from the detailed description that follows below.

BRIEF DESCRIPTION OF THE DRAWINGS

The present disclosure is illustrated by way of example and not limitation in the figures of the accompanying drawings, in which like references indicate similar elements and in which.

DETAILED DESCRIPTION OF THE PREFERRED EMBODIMENTS

Generally, the present disclosure relates to techniques for minimizing the bandwidth needed to transmit angle modulated signals using sideband suppression. Minimizing the bandwidth allows more transmissions in any given part of the frequency spectrum. A single spectrum component can vary in amplitude. For example, when someone talks into an angle modulated transmitter, the carrier varies in amplitude. If the sideband pairs can be phased/filtered out, what is left is the carrier varying in amplitude.

In some examples, techniques described herein filter/phase out sideband pairs, leaving the carrier. The amplitude variations of the carrier can be used to convey information (i.e., nearly zero bandwidth transmission of information). Sideband pairs can be phased and/or filtered out utilizing the techniques described below. System and methods are described below for dramatically minimizing, to nearly zero, the bandwidth needed to transmit digital information using sideband suppression of angle modulated signals.

Figure 1:
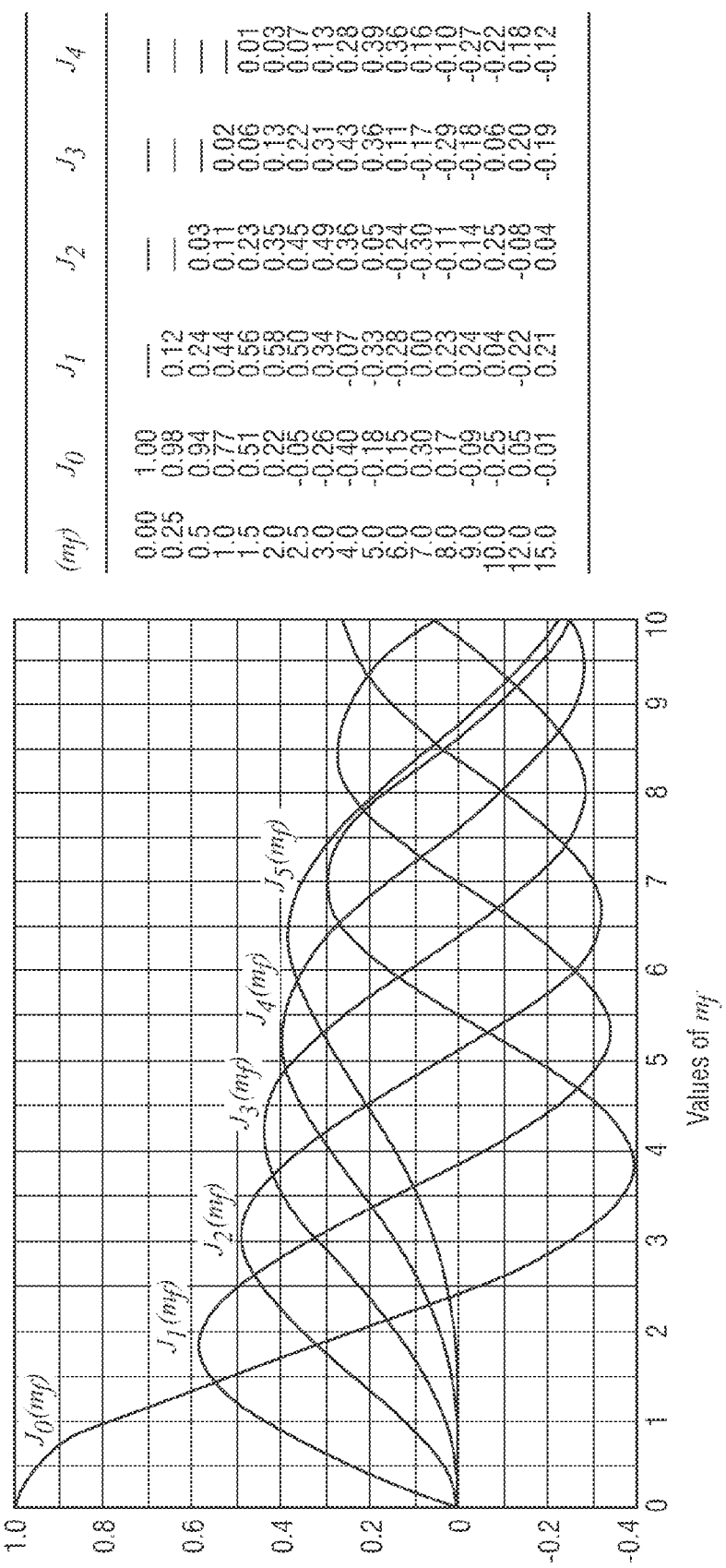
FIG. 1 illustrates a table and a graph of Bessel functions.
Figure 2:
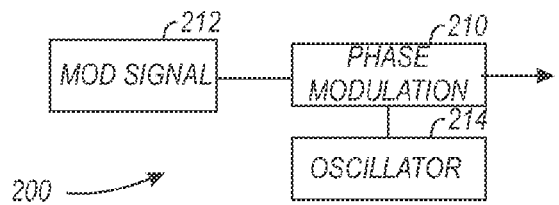
FIG. 2 is a block diagram is an exemplary phase modulated system.
Figure 3:
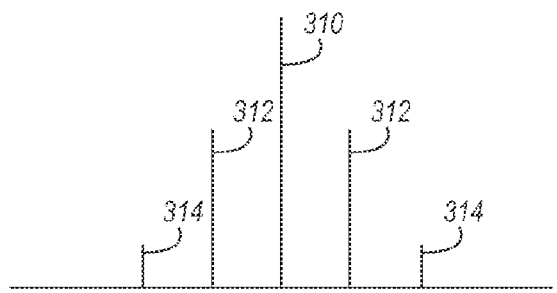
FIG. 3 shows the frequency spectrum of the modulated output of the system shown in FIG. 2 with a modulation index of 1.0.

FIG. 2 is a block diagram of an exemplary phase modulated system (with a modulation index (mi) of 1). The phase modulated system 200 includes a phase modulation circuit 210 that receives inputs from an audio frequency input signal 212 and an oscillator circuit 214. FIG. 3 shows the frequency spectrum of the modulated output of the system 200 shown in FIG. 2. FIG. 3 shows the full spectrum for angle modulation with a modulation index of 1.0. The frequency spectrum of FIG. 3 shows the frequency components of the carrier 310, as well as first order sideband pairs 312 and second order sideband pairs 314. Note that higher order sidebands are not shown. The amplitudes in the frequency spectrum are given by the Bessel functions referenced above and shown in FIG. 1.

Figure 4:
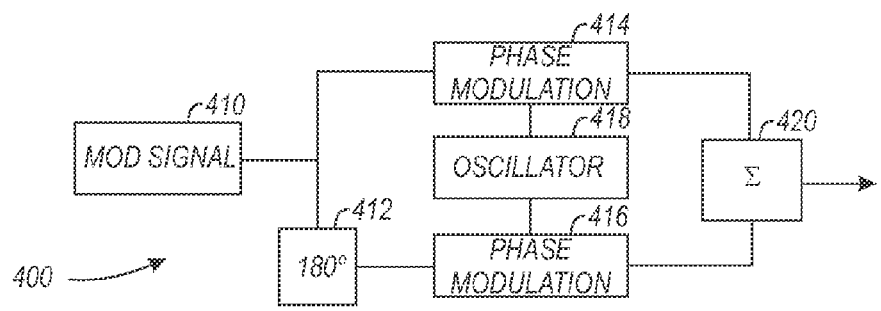
FIG. 4 shows an example of a system for minimizing bandwidth by phasing out all odd order sidebands.
Figure 5:
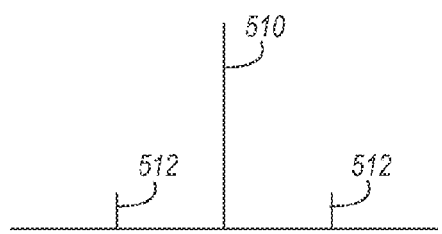
FIG. 5 shows the frequency spectrum of the system shown in FIG. 4.

FIG. 4 shows a first example of a system for minimizing bandwidth by phasing out sidebands. FIG. 4 is a block diagram of a phase modulated system 400 (mi=1) where the modulating signal is shifted (180 degrees) and combined with the non-shifted modulated signal. The system 400 receives an input signal 410, which is provided to a phase modulation circuit 414. The input signal 410 is also shifted 180 degrees by phase shift circuit 412 and provided to a second phase modulation circuit 416. An oscillator circuit 418 provides an oscillation signal to both phase modulation circuits 414 and 416. The outputs of the phase modulation circuits 414 and 416 are combined by summing circuit 420 to produce an output signal. FIG. 5 shows the frequency spectrum of the output of the system 400 shown in FIG. 4. When analyzed via fast fourier transform (FFT), all odd order sideband pairs are phased out. The frequency spectrum of FIG. 5 shows the frequency components of the carrier 510 and the second order sideband pairs 514. Note that higher order sidebands are not shown.

Figure 6:
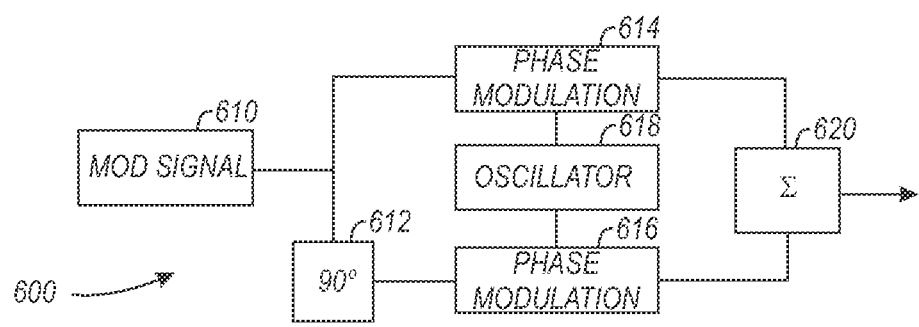
FIG. 6 shows an example of a system for minimizing bandwidth by phasing out the second order sidebands.
Figure 7:
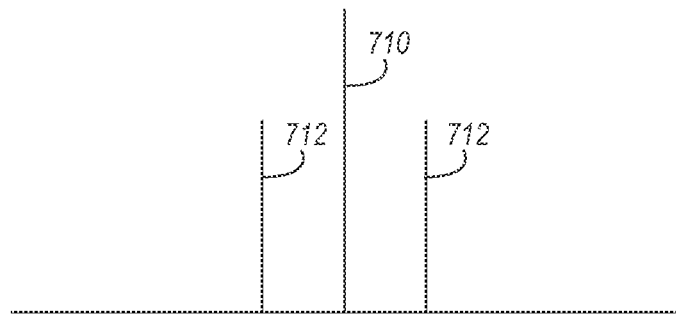
FIG. 7 shows the frequency spectrum of the system shown in FIG. 6.

FIG. 6 shows a second example of a system for minimizing bandwidth by phasing out sidebands. FIG. 6 is a block diagram of a phase modulated system 600 (mi=1) where the modulating signal is shifted (90 degrees) and combined with the non-shifted modulated signal. The system 600 receives an input signal 610, which is provided to a phase modulation circuit 614. The input signal 610 is also shifted 90 degrees by phase shift circuit 612 and provided to a second phase modulation circuit 616. An oscillator circuit 618 provides an oscillation signal to both phase modulation circuits 614 and 616. The outputs of the phase modulation circuits 614 and 616 are combined by summing circuit 620 to produce an output signal. FIG. 7 shows the frequency spectrum of the output of the system 600 shown in FIG. 6. When analyzed via FFT, the second order sideband pair is phased out. The frequency spectrum of FIG. 7 shows the frequency components of the carrier 710 and the first order sideband pair 712. Note that higher order sidebands are not shown.

This same concept can be continued to phase out other order sideband pairs. For example, a 45 degree shift phases out the fourth order sideband pair, a 22.5 degree shift phases out the sixth order sideband pair, etc. The following are examples of systems for minimizing bandwidth by phasing out additional sideband pairs.

Figure 8:
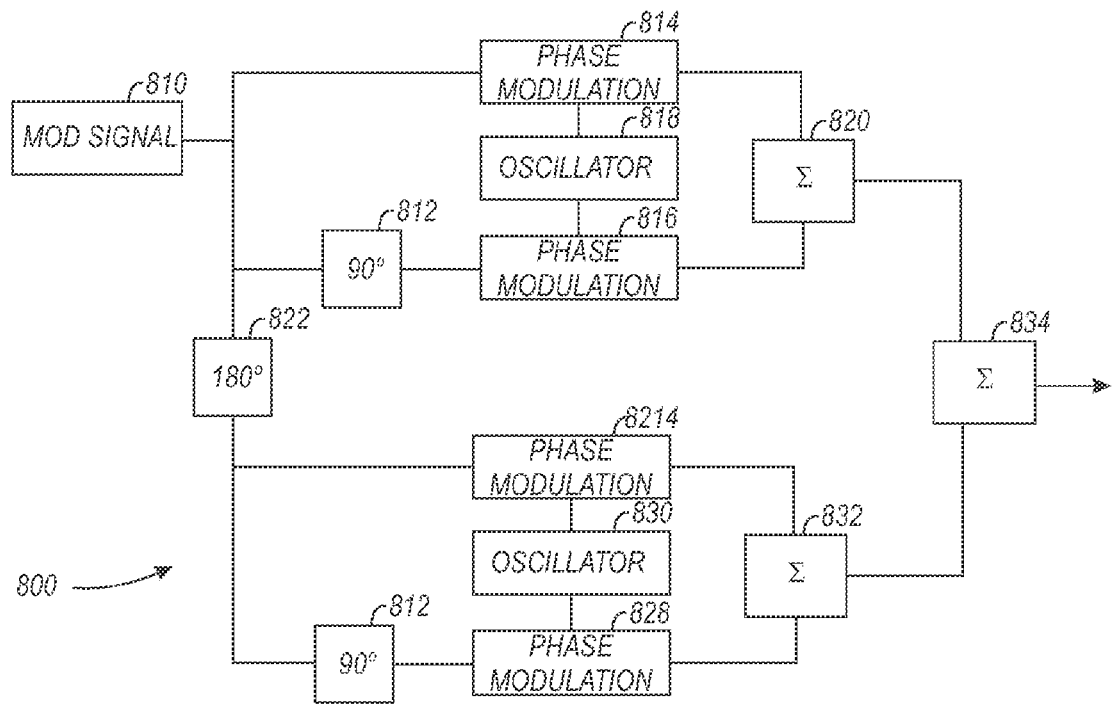
FIG. 8 shows an example of a system for minimizing bandwidth by phasing out multiple order sideband pairs.

FIG. 8 shows an example of a system that combines the systems shown in FIGS. 4 and 6, resulting in the first, second, and third order sideband pairs phased out. FIG. 8 shows another example of a system for minimizing bandwidth by phasing out sidebands. FIG. 8 is a block diagram of a phase modulated system 800 (mi=1) where the modulating signal is shifted (90, 180, and 270 degrees) and combined with the non-shifted modulated signal. The system 800 receives an input signal 810, which is provided to a first phase modulation circuit 814. The input signal 810 is also shifted 90 degrees by phase shift circuit 812 and provided to a second phase modulation circuit 816. A first oscillator circuit 818 provides an oscillation signal to both phase modulation circuits 814 and 816. The outputs of the phase modulation circuits 814 and 816 are combined by summing circuit 820 to produce an output signal.

The input signal 810 is also shifted 180 degrees by second phase shift circuit 822. The output of the phase shift circuit 822 is provided to a third phase modulation circuit 824. The output of the phase shift circuit 822 is also shifted 90 degrees by third phase shift circuit 826 and provided to a fourth phase modulation circuit 828. A second oscillator circuit 830 provides an oscillation signal to both phase modulation circuits 824 and 828. The outputs of the phase modulation circuits 824 and 828 are combined by second summing circuit 832 to produce an output signal. The outputs of the summing circuits 820 and 832 are combined by third summing circuit 834 to produce an output signal.

Figure 9:
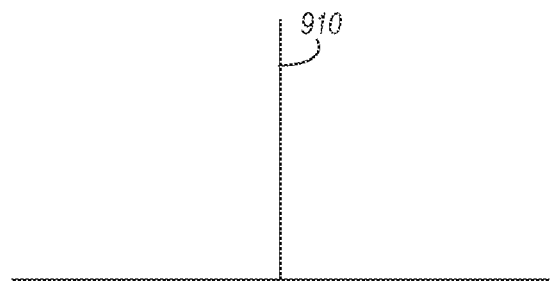
FIG. 9 shows the frequency spectrum of the system shown in FIG. 8.

FIG. 9 shows the frequency spectrum of the output of the system 800 shown in FIG. 8. When analyzed via FFT, the first, second, and third order sideband pairs are phased out. The frequency spectrum of FIG. 9 shows the frequency components of the carrier 910. Note that higher order sidebands are not shown. This example allows for carrier signal amplitude variation of 40 to 50 percent before the fourth order sideband pair begins to emerge.

Figure 10:
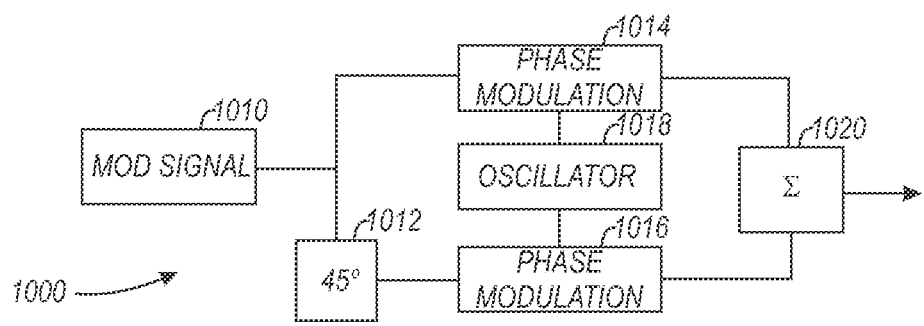
FIG. 10 shows an example of a system for minimizing bandwidth by phasing out the fourth order sidebands.
Figure 11:
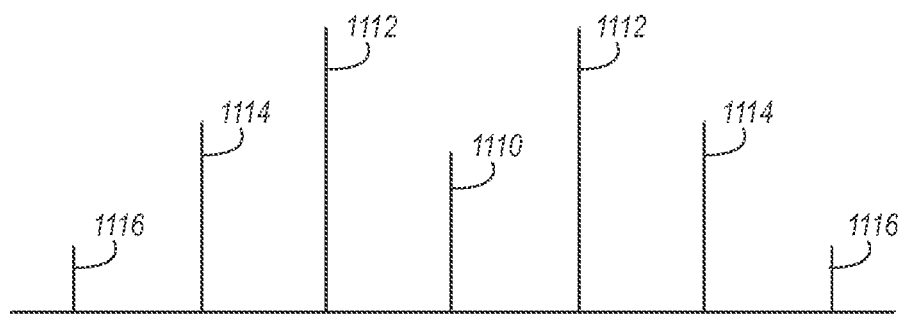
FIG. 11 shows the frequency spectrum of the system shown in FIG. 10.

FIG. 10 shows another example of a system for minimizing bandwidth by phasing out sidebands. FIG. 10 is a block diagram of a phase modulated system 1000 (mi=2) where the modulating signal is shifted (45 degrees) and combined with the non-shifted modulated signal. The system 1000 receives an input signal 1010, which is provided to a phase modulation circuit 1014. The input signal 1010 is also shifted 45 degrees by phase shift circuit 1012 and provided to a second phase modulation circuit 1016. An oscillator circuit 1018 provides an oscillation signal to both phase modulation circuits 1014 and 1016. The outputs of the phase modulation circuits 1014 and 1016 are combined by summing circuit 1020 to produce an output signal. FIG. 11 shows the frequency spectrum of the output of the system 1000 shown in FIG. 10 with a modulation index of 2.0. When analyzed via FFT, the fourth order sideband pair is phased out. The frequency spectrum of FIG. 11 shows the frequency components of the carrier 1110, the first order sideband pairs 1112, the second order sideband pairs 1114, and the third order sideband pairs 1116. Note that higher order sidebands are not shown.

Figure 12:
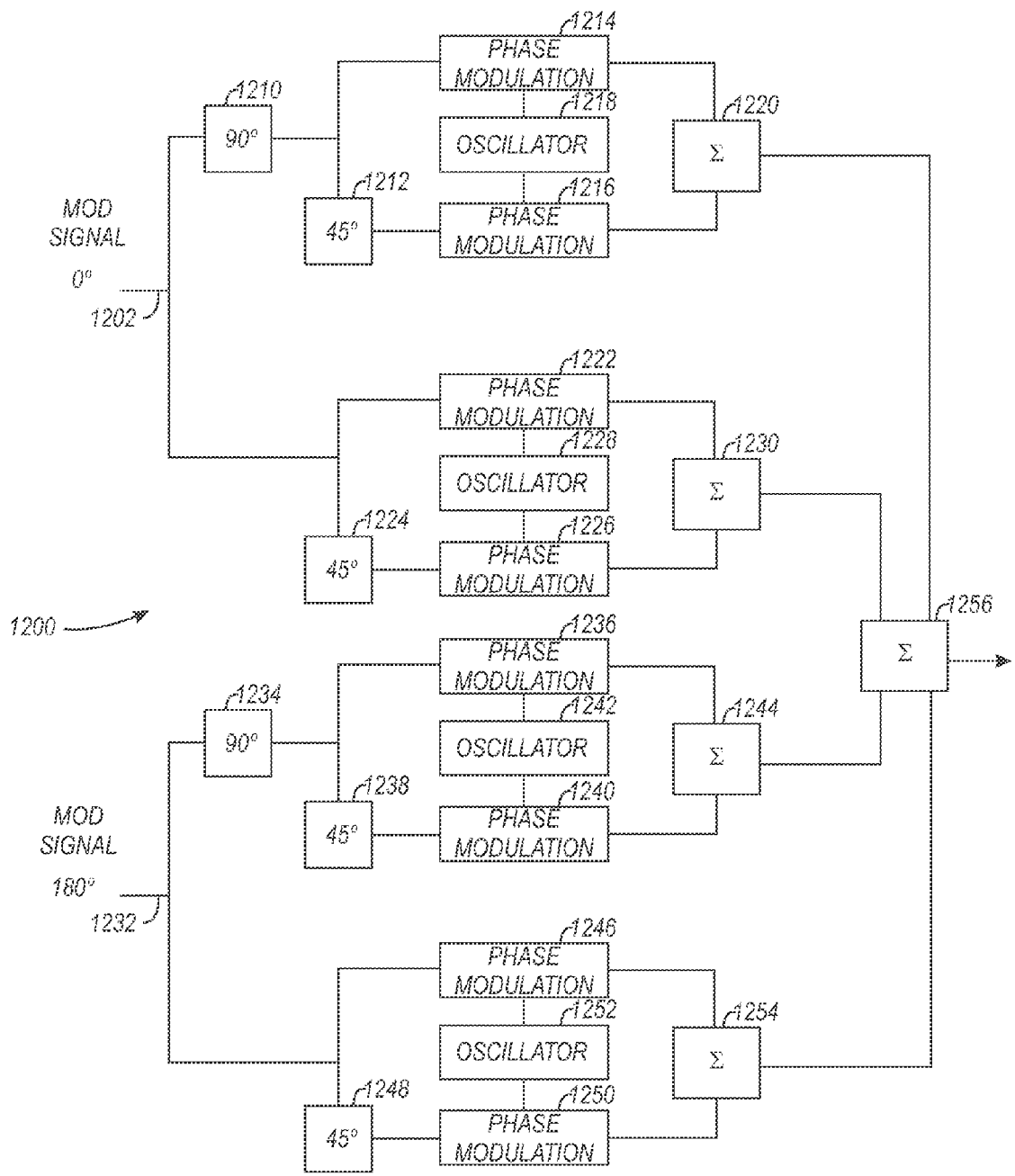
FIG. 12 shows an example of a system for minimizing bandwidth by phasing out multiple order sideband pairs.

FIG. 12 shows an example of a system that combines the systems shown in FIGS. 8 and 10, resulting in the first, second, third, fourth, and fifth order sideband pairs phased out. FIG. 12 shows another example of a system for minimizing bandwidth by phasing out sidebands. FIG. 12 is a block diagram of a phase modulated system 1200 (mi=2) where the modulating signal is shifted (45, 90, 135, 180, 225, 270, and 315 degrees) and combined with the non-shifted modulated signal. The system 1200 receives an input signal 1202, which is shifted 90 degrees by a first phase shift circuit 1210. The output of phase shift circuit 1210 is provided to a first phase modulation circuit 1214. The output of phase shift circuit 1210 is also shifted 45 degrees by second phase shift circuit 1212 and provided to a second phase modulation circuit 1216. A first oscillator circuit 1218 provides an oscillation signal to both phase modulation circuits 1214 and 1216. The outputs of the phase modulation circuits 1214 and 1216 are combined by first summing circuit 1220.

The input signal 1202 is also provided to a third phase modulation circuit 1222. The input signal 1202 is also shifted 45 degrees by third phase shift circuit 1224. The output of the phase shift circuit 1224 is provided to a fourth phase modulation circuit 1226. A second oscillator circuit 1228 provides an oscillation signal to both phase modulation circuits 1222 and 1226. The outputs of the phase modulation circuits 1222 and 1226 are combined by second summing circuit 1230.

FIG. 12 also shows a second input signal 1232, which is the first input signal 1202 shifted 180 degrees by a phase shift circuit (not shown). The second input signal 1232 is shifted 90 degrees by a fourth phase shift circuit 1234. The output of phase shift circuit 1234 is provided to a fifth phase modulation circuit 1236. The output of phase shift circuit 1234 is also shifted 45 degrees by fifth phase shift circuit 1238 and provided to a sixth phase modulation circuit 1240. A third oscillator circuit 1242 provides an oscillation signal to both phase modulation circuits 1236 and 1240. The outputs of the phase modulation circuits 1236 and 1240 are combined by third summing circuit 1244.

The second input signal 1232 is also provided to a seventh phase modulation circuit 1246. The second input signal 1232 is also shifted 45 degrees by sixth phase shift circuit 1248. The output of the phase shift circuit 1248 is provided to an eighth phase modulation circuit 1250. A fourth oscillator circuit 1252 provides an oscillation signal to both phase modulation circuits 1246 and 1250. The outputs of the phase modulation circuits 1246 and 1250 are combined by fourth summing circuit 1254. The outputs of the summing circuits 1220, 1230, 1244, and 1254 are combined by fifth summing circuit 1256 to produce an output signal.

Figure 13:
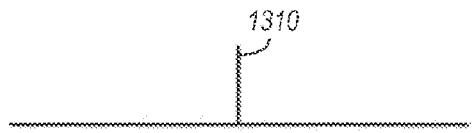
FIG. 13 shows the frequency spectrum of the system shown in FIG. 12.

FIG. 13 shows the frequency spectrum of the output of the system 1200 shown in FIG. 12. When analyzed via FFT, the first, second, third, fourth, and fifth order sideband pairs are phased out. The frequency spectrum of FIG. 13 shows just the frequency components of the carrier 1310. Note that higher order sidebands are not shown. This example allows for carrier signal amplitude variation of 100 percent before the sixth order sideband pair begins to emerge.

Figure 14:
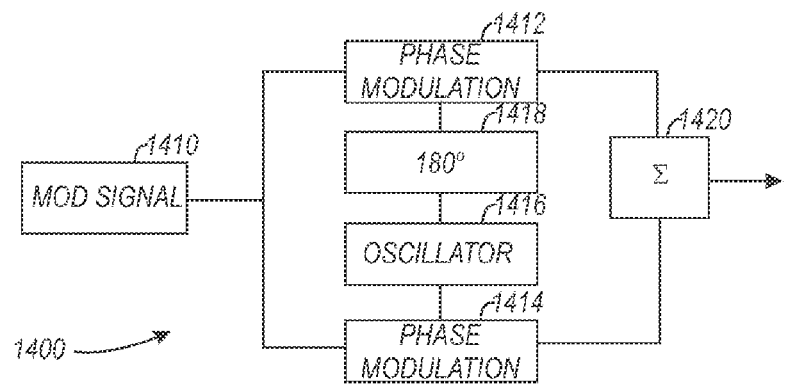
FIG. 14 shows an example of a system for minimizing bandwidth by phasing out the carrier and sideband pairs.
Figure 15:
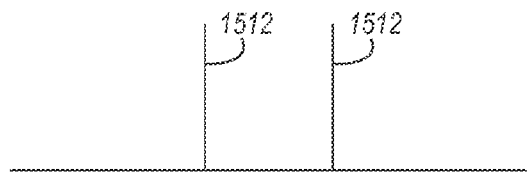
FIG. 15 shows the frequency spectrum of the system shown in FIG. 14.

FIG. 14 shows another example of a system for minimizing bandwidth. FIG. 14 is a block diagram of a phase modulated system 1400 (mi=1) where an oscillating signal (and a 180 degree shifted oscillating signal) are provided to two phase modulation circuits with outputs that are combined. The system 1400 receives an input signal 1410, which is provided to first and second phase modulation circuits 1412 and 1414. An oscillator circuit 1416 provides an oscillation signal to phase modulation circuit 1414. The oscillation signal is shifted 180 degrees by phase shift circuit 1418 and provided to the phase modulation circuit 1412. The outputs of the phase modulation circuits 1412 and 1414 are combined by summing circuit 1420 to produce an output signal. FIG. 15 shows the frequency spectrum of the output of the system 1400 shown in FIG. 14. When analyzed via FFT, the frequency components of the carrier and even order sideband pairs are phased out. The frequency spectrum of FIG. 15 shows the frequency components of the first order sideband pairs 1512. Note that higher order sidebands are not shown.

Figure 16:
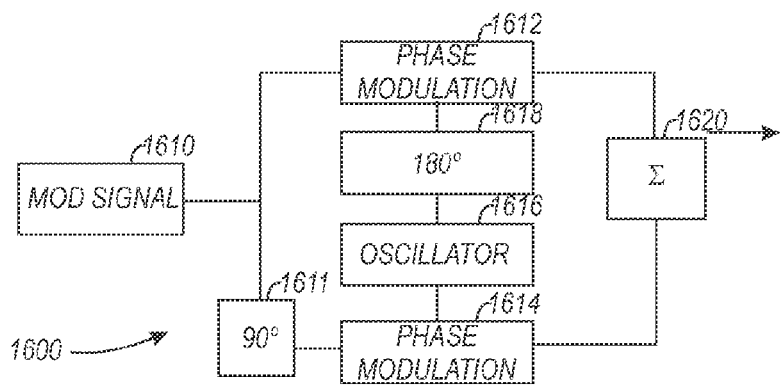
FIG. 16 shows an example of a system for minimizing bandwidth by phasing out the carrier.
Figure 17:
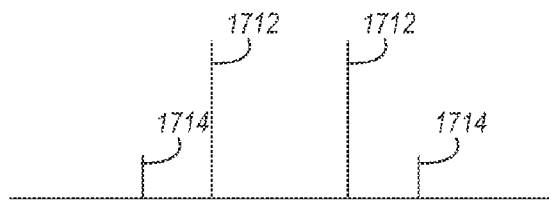
FIG. 17 shows the frequency spectrum of the system shown in FIG. 16.

FIG. 16 shows another example of a system for minimizing bandwidth. FIG. 16 is a block diagram of a phase modulated system 1600 (mi=1) where an oscillating signal (and a 180 degree shifted oscillating signal) are provided to two phase modulation circuits and combined. The system 1600 receives an input signal 1610, which is provided to first phase modulation circuit 1612. The input signal 1610 is also shifted 90 degrees by phase shift circuit 1611 and provided to second phase modulation circuit 1614. An oscillator circuit 1616 provides an oscillation signal to phase modulation circuit 1614. The oscillation signal is shifted 180 degrees by phase shift circuit 1618 and provided to the phase modulation circuit 1612. The outputs of the phase modulation circuits 1612 and 1614 are combined by summing circuit 1620 to produce an output signal. FIG. 17 shows the frequency spectrum of the output of the system 1600 shown in FIG. 16. When analyzed via FFT, the frequency components of the carrier are phased out, but the sideband pairs remain. The frequency spectrum of FIG. 15 shows the frequency components of the first and second order sideband pairs 1512 and 15114. Note that higher order sidebands are not shown.

Described above are various methods of phasing out sidebands. However, angle modulation is a nonlinear system.

When a complex signal is used to modulate the carrier, "beat" frequencies are generated. In one example, a two tone modulating signal is used, such as a binary frequency-shift keying (FSK) scheme. With this scheme, a "1" is related to a first frequency, and a "0" is related to a second frequency. In the frequency domain, the sum and difference frequencies show up as sideband pairs.

When a two tone modulating signal is applied to a circuit such as that shown in FIG. 8, for example, all sideband pairs are phased out except for the "difference" frequency sidebands. The vector sum of this sideband pair is collinear with the carrier as amplitude variations in the time domain. Note that higher order, but relatively small sideband pairs (for example at two times the frequency difference, etc.) exist.

Figure 18:
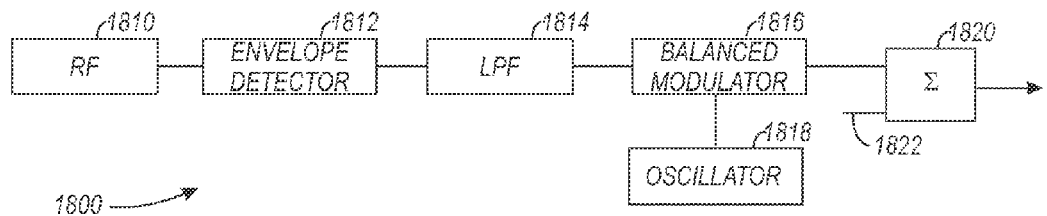
FIG. 18 is a block diagram of a system that receives a two tone input signal and provides an output with the sidebands phased out.

This sideband pair can also be phased out. For example, if the two tone modulating signal (i.e., an RF signal) is fed through an envelope detector and then a low pass filter, the difference frequency is produced. FIG. 18 is a block diagram of a system 1800 that receives an RF two tone input signal and provides an output with the sidebands phased out. As shown, a two tone input signal 1810 is provided to envelope detector circuitry 1812. The output of envelope detector circuitry 1812 is provided to low pass filter circuitry 1814. The low pass filter circuitry 1814 produces the difference frequencies of the components in the RF input signal. The difference frequency (the output of the low pass filter circuitry 1814) is provided to balanced modulator circuitry 1816, which receives an oscillation signal from oscillator circuitry 1818. The oscillator circuitry may be the same oscillator circuitry as that shown in the figures described above.

The output of the balanced modulator circuitry 1816 is combined in linear fashion with the output of the systems shown in FIG. 8 or 12 by summing circuit 420 to phase out the difference frequency sideband pairs. The outputs of the systems shown in FIG. 8 or 12 are provided to input 1822 in FIG. 18. The output of the summing circuit 1820 will then contain only the carrier signal.

Figure 19:
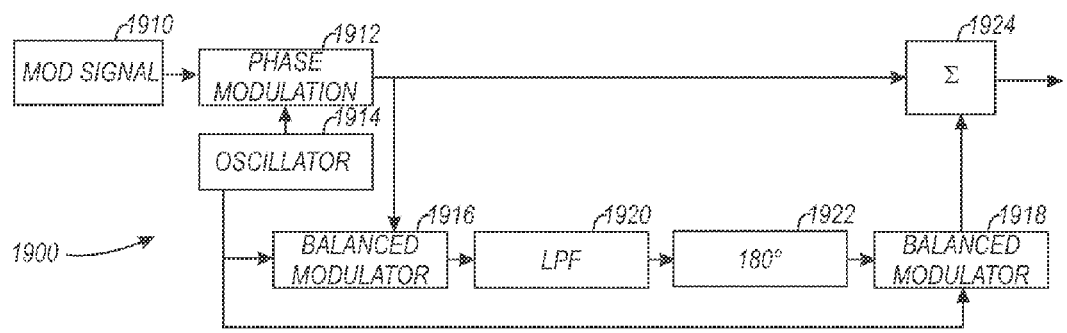
FIG. 19 is a block diagram showing another example of a system for minimizing bandwidth by separating sidebands from the carrier using a balanced modulator.

FIG. 19 is a block diagram showing another example of a system for minimizing bandwidth by separating sidebands from the carrier using a balanced modulator. The sidebands are added back (shifted 180 degrees) to phase out the sidebands. The system 1900 receives an input signal 1910, which is provided to a phase modulation circuit 1912. An oscillator circuit 1914 provides an oscillation signal to the phase modulation circuit 1912, as well as balanced modulation circuits 1916 and 1918. The output of the phase modulation circuit 1912 is provided to the balanced modulation circuit 1916. The balanced modulation circuit 1916 separates the sidebands from the carrier, and provides an input to the low pass filter 1920. The sidebands are shifted 180 degrees using the phase shift circuit 1922 and provided to the balanced modulation circuit 1918. The output of the phase modulation circuit 1912 (the composite signal) is combined with the output of the balanced modulation circuit 1918 (the 180 degrees shifted sidebands) by summing circuit 1924 to produce an output signal containing no sidebands.

Figure 20:
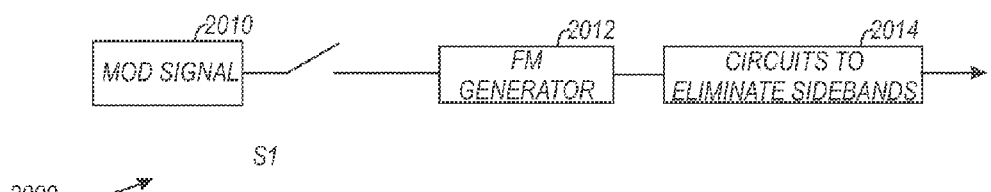
FIG. 20 is a block diagram of a transmitter using two tone modulation.
Figure 21:
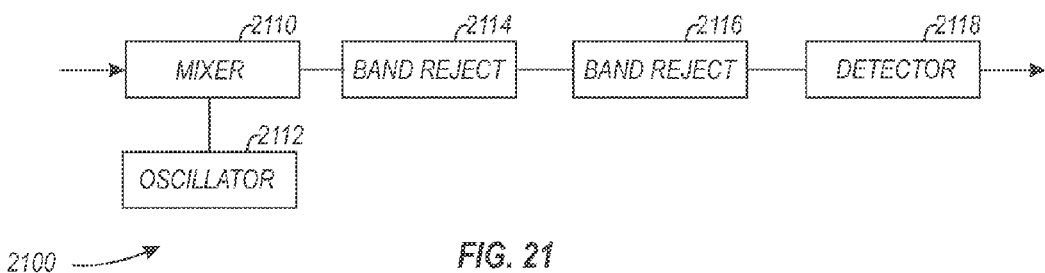
FIG. 21 is a block diagram of a receiver using two tone modulation.

Using the teaching above, a complete transmitting system can be built. FIG. 20 is a broad block diagram of a transmitter 2000 using two tone modulation (e.g., FSK). A modulation signal 2010 is selectively switched via switch S1, for example, ON to represent a binary "1" and OFF to represent a binary "0", or vice versa. When switch S1 is keyed on and off, two different amplitudes of the carrier are generated. The modulation signal 2010 is provided to FM generator 2012, and then to block 2014, which may comprise any desired circuit to eliminate sidebands, such as the examples provided above. FIG. 21 is a broad block diagram of a corresponding receiver 2100. The receiver 2100 includes a mixer 2110 and oscillator 2112. The band reject filters 2114 and 2116 (e.g., low band and high band filters) make the receiver operate at a narrow band by rejecting nearby signals, while allowing signals near the carrier frequency to pass to the detector circuit 2118.

Figure 22:
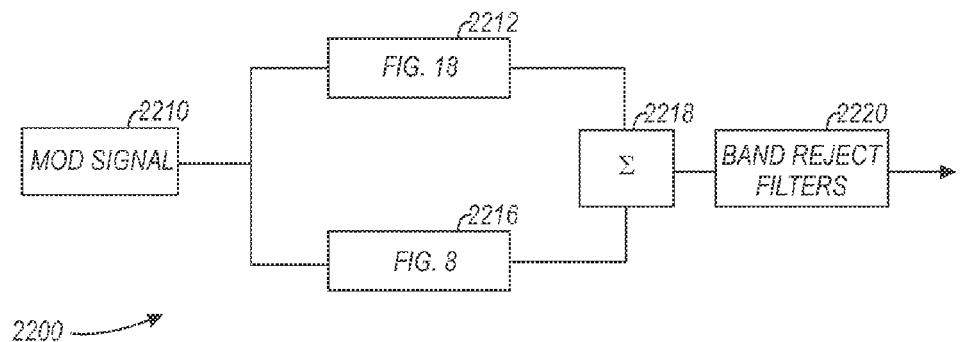
FIG. 22 is a block diagram of an exemplary transmitting system.
Figure 23:
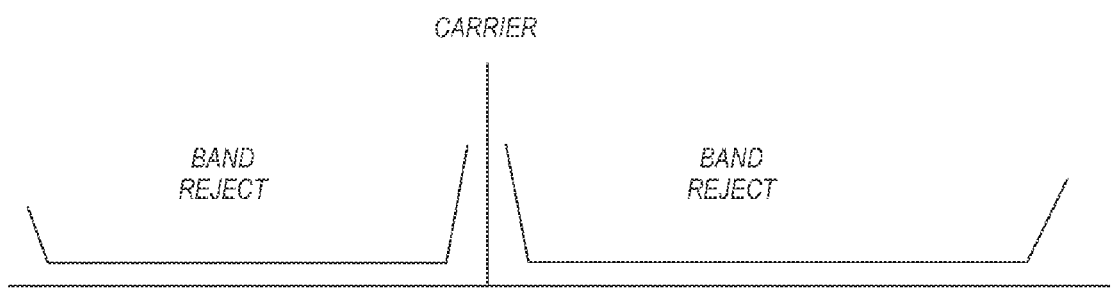
FIG. 23 is a diagram illustrating the band reject filters shown in FIG. 22.

FIG. 22 is a more detailed example of a transmitting system 2200 utilizing techniques described above. Numerous other examples are also possible. FIG. 22 shows an input modulating signal 2210. The modulating signal 2210 is provided to block 2212, which is the circuit shown in FIG. 18. As described above, the output of block 2212 will include the carrier, with sidebands phased out. The modulating signal 2210 is also provided as an input to block 2216, which is the circuit shown in FIG. 8. As described above, the output of block 2216 will include the carrier, with the second and odd order sidebands phased out. The outputs of blocks 2212 and 2216 are combined using summing circuit 2218. In the output of the summing circuit 2218, the difference order sideband pairs are phased out. Band reject filters 2220 are then used to reject fourth and higher order sidebands. FIG. 23 is a diagram illustrating the band reject filters in the frequency domain.

At the receiver, band reject filters can also be used to take advantage of the extremely narrow bandwidth of the transmitted signal, since the receiver should be limited in its bandwidth. In the frequency domain, the band reject filters of the receiver will look similar to the filters illustrated in FIG. 22. The slope of the filter skirts determines the "sharpness" of the system.

Figure 24:
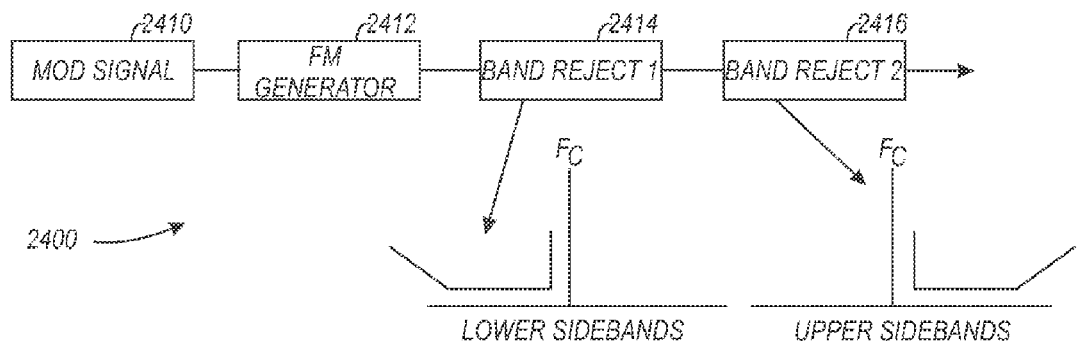
FIG. 24 is a block diagram of a system using band reject filters to reject sidebands.
Figure 25:
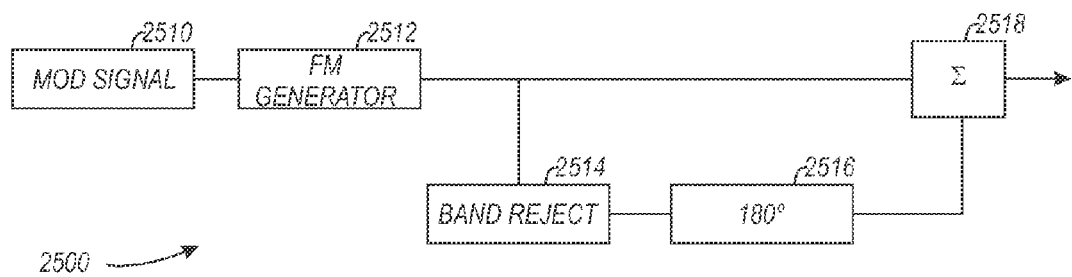
FIG. 25 is a block diagram of a system using a band reject filter and a shift circuit to eliminate sidebands.
Figure 26:
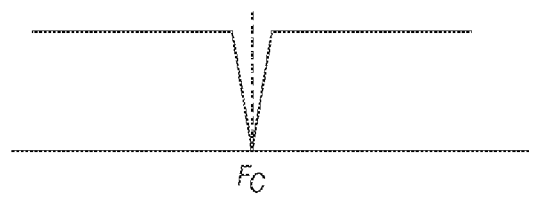
FIG. 26 is a diagram illustrating the band reject filter shown in FIG. 25.

Other examples of systems to reduce bandwidth requirements of a transmission system can utilize band reject and bandpass filters. FIG. 24 is a block diagram of a system 2400 where a modulation signal 2410 is provided to FM generator 2412. First and second band reject filters 2414 and 2416 are used to reject the lower and upper sidebands, respectively. FIG. 25 shows an example of a system using a band reject filter and a shift circuit to eliminate sidebands. FIG. 25 shows a system 2500 where a modulation signal 2510 is provided to FM generator 2512. The output of the FM generator 2512 is provided to a band reject filter 2514. FIG. 26 shows the band reject filter in the frequency domain. The band reject filter 2514 rejects the carrier and allows the sidebands to pass to phase shifter 2516, which shifts the sidebands 180 degrees. The shifted sidebands are combined with the composite signal from the FM generator 2512 by summing circuit 2518, which phases out the sidebands.

Figure 27:
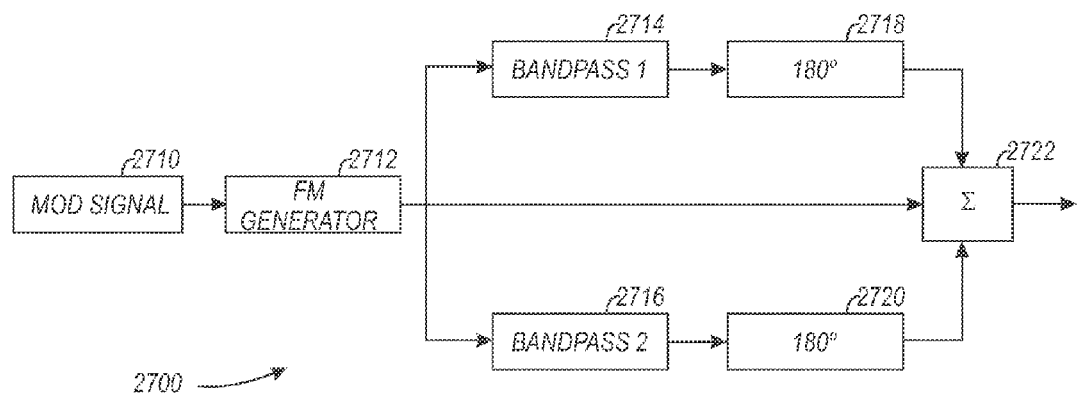
FIG. 27 is a block diagram of a system using bandpass filters and shift circuits to eliminate sidebands.
Figure 28:
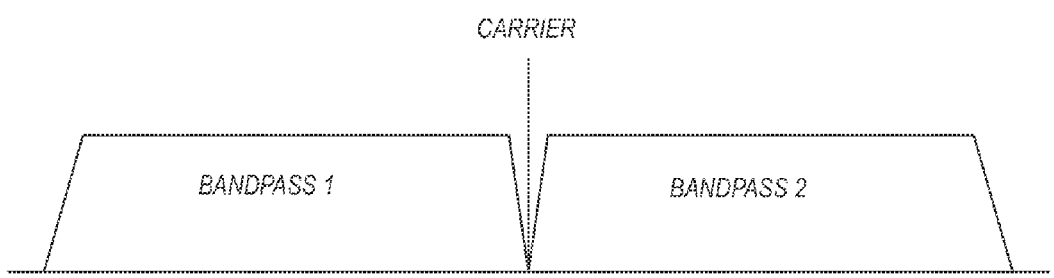
FIG. 28 is a diagram illustrating the bandpass filters shown in FIG. 27.

FIG. 27 is a block diagram of a similar system. FIG. 27 shows a system 2700 where a modulation signal 2710 is provided to FM generator 2712. The output of the FM generator 2712 is provided to first and second bandpass filters 2714 and 2716, which allow the lower and upper sidebands to pass, respectively, while blocking the carrier. Each of the filtered sidebands is shifted 180 by phase shifters 2718 and 2720, and combined with the composite signal from the FM generator 2712 by summing circuit 2722, which phases out the sidebands. The same scheme will work on the receiver end. FIG. 28 shows the first and second bandpass filters 2714 and 2716 in the frequency domain.

Figure 29:
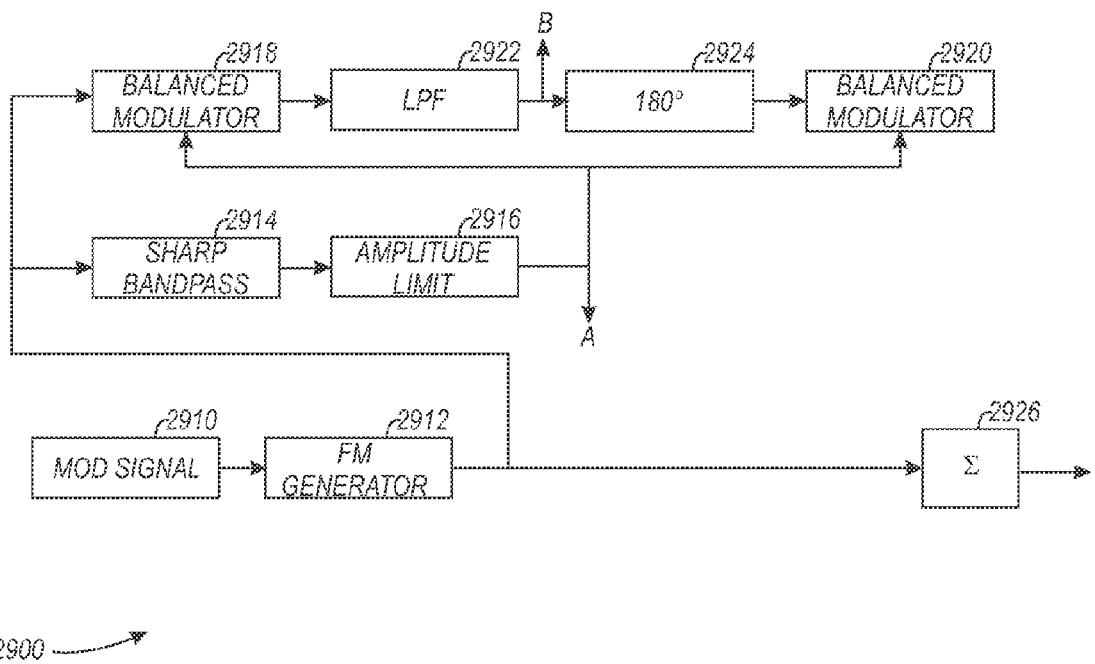
FIG. 29 is a block diagram of a system with sidebands filtered and limited.
Figure 30:
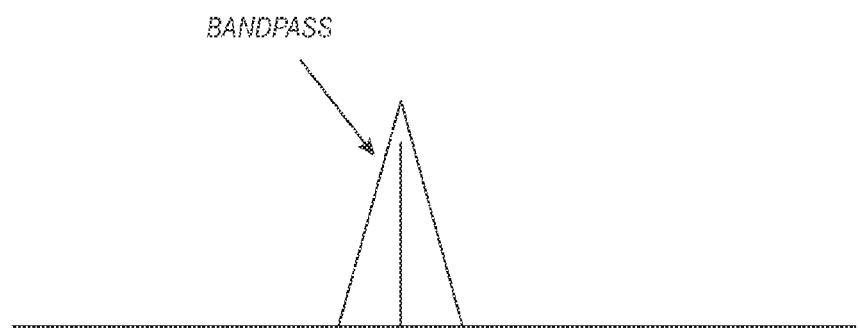
FIG. 30 is a diagram illustrating the bandpass filter shown in FIG. 29.

FIG. 29 is a block diagram of another exemplary system. FIG. 29 shows a system 2900 where a modulation signal 2910 is provided to a FM generator 2912. The output of the FM generator 2912 is provided to a sharp bandpass filter 2914 (which is illustrated in the FIG. 30 in the frequency domain) and then an amplitude limit circuit 2916. The output of the amplitude limit circuit 2916 is the carrier signal, and is provided to first and second balanced modulators 2918 and 2920. The output of the FM generator 2912 is also provided to the first balanced modulator 2918. The output of the balanced modulator 2918 is provided to a low pass filter. The output of the low pass filter 2922 contains the audio frequencies corresponding to the sideband pairs, which is then shifted 180 degrees by shift circuit 2924 and fed to balanced modulator 2920. The output of the balanced modulator 2920 is linearly combined with the composite signal from the FM generator 2912 by summing circuit 2926, which phases out the sidebands.

Note that the various circuit represented by blocks in the block diagrams (e.g., modulators, shifters, oscillators, summers, detectors, filters, FM generators, etc.) can be provided by any standard circuit, as one skilled in the art would understand.

In the preceding detailed description, the disclosure is described with reference to specific exemplary embodiments thereof. Various modifications and changes may be made thereto without departing from the broader spirit and scope of the disclosure as set forth in the claims. The specification and drawings are, accordingly, to be regarded in an illustrative rather than a restrictive sense.

What is claimed is:

1. A method of minimizing the bandwidth needed to transmit signals using angle modulation, the method comprising:
   providing a modulating input signal;
   phase modulating the modulating input signal using first phase modulation circuitry; phase shifting the modulating input signal by 90 degrees using first phase shift circuitry; phase modulating the 90 degree phase shifted modulating input signal using second phase modulation circuitry; phase shifting the modulating input signal by 180 degrees using second phase shift circuitry; phase modulating the 180 degree phase shifted modulating input signal using third phase modulation circuitry; phase shifting the modulating input signal by 270 degrees using third phase shift circuitry; phase modulating the 270 degree phase shifted modulating input signal using fourth phase modulation circuitry; and combining outputs of the first, second, third, and fourth phase modulation circuitry to thereby provide for phasing out one or more sideband pairs from the modulating input signal.

2. The system of claim 1, wherein odd order sideband pairs are phased out.

3. The system of claim 1, wherein second order sideband pairs are phased out.

4. The system of claim 1, wherein second order sideband pairs and odd order sideband pairs are phased out.

5. The system of claim 1, wherein fourth order sideband pairs are phased out.

6. The system of claim 1, wherein the one or more sideband pairs are phased out using phase shift circuitry to phase shift the modulating input signal and combining the phase modulated input signal with a modulated phase shifted input signal.

7. A system for suppressing sidebands in angle modulated signals comprising:
   first phase modulation circuitry modulates a modulation signal;
   first phase shift circuitry phase shifts the modulation signal by a first amount;
   second phase modulation circuitry modulates the shifted modulation signal; and
   second phase shift circuitry phase shifts the modulation signal by a second amount;
   third phase modulation circuitry modulates the modulation signal shifted by the second phase shift circuitry;
   third phase shift circuitry phase shifts the modulation signal by a third amount;
   fourth phase modulation circuitry modulates the modulation signal shifted by the third phase shift circuitry; and
   summing circuitry combines outputs of the first, second, third, and fourth phase modulation circuitry; wherein the first, second, and third phase shift circuitry shifts the modulation signal by 90, 180, and 270 degrees, respectively.

8. The system of claim 7, wherein the modulation signal is a two tone modulating signal.

9. The system of claim 8, wherein the two tone modulating signal is modulated using binary frequency-shift keying.

* * * * *